United States Patent
Lee et al.

(10) Patent No.: US 9,006,777 B2
(45) Date of Patent: Apr. 14, 2015

(54) ORGANIC LIGHT-EMITTING DISPLAY AND METHOD OF MANUFACTURING THE SAME

(71) Applicant: Samsung Display Co., Ltd., Yongin, Gyeonggi-Do (KR)

(72) Inventors: Ung-Soo Lee, Yongin (KR); Jae-Sun Lee, Yongin (KR); Hun Kim, Yongin (KR); Jai-Hyuk Choi, Yongin (KR); Su-Hyuk Choi, Yongin (KR); Jin-Woo Park, Yongin (KR)

(73) Assignee: Samsung Display Co., Ltd., Gyeonggi-Do (KR)

( * ) Notice: Subject to any disclaimer, the term of this patent is extended or adjusted under 35 U.S.C. 154(b) by 0 days.

(21) Appl. No.: 14/036,479

(22) Filed: Sep. 25, 2013

(65) Prior Publication Data

US 2014/0319476 A1    Oct. 30, 2014

(30) Foreign Application Priority Data

Apr. 29, 2013    (KR) .................... 10-2013-0047694

(51) Int. Cl.
  *H01L 27/32*    (2006.01)
  *H01L 33/56*    (2010.01)
(52) U.S. Cl.
  CPC ............... *H01L 27/32* (2013.01); *H01L 33/56* (2013.01)
(58) Field of Classification Search
  CPC .................... H01L 27/32; H01L 33/56
  USPC ................... 257/100, 789; 438/127
  See application file for complete search history.

(56) References Cited

U.S. PATENT DOCUMENTS

| | | | |
|---|---|---|---|
| 5,397,920 A * | 3/1995 | Tran ............................. | 257/749 |
| 7,722,929 B2 | 5/2010 | Aitken et al. | |
| 8,618,538 B2 * | 12/2013 | Khang et al. ................. | 257/43 |
| 2008/0278070 A1 * | 11/2008 | Kim ............................. | 313/504 |
| 2009/0057674 A1 * | 3/2009 | Jeong et al. ................... | 257/59 |
| 2010/0065882 A1 * | 3/2010 | Matsumoto et al. ........... | 257/99 |
| 2011/0140094 A1 * | 6/2011 | Choi et al. .................... | 257/43 |
| 2011/0227075 A1 * | 9/2011 | Stainer et al. ................. | 257/57 |
| 2012/0138920 A1 * | 6/2012 | Khang et al. ................. | 257/43 |
| 2012/0187448 A1 * | 7/2012 | Matsumoto ................... | 257/100 |
| 2014/0042403 A1 * | 2/2014 | Lee et al. ..................... | 257/40 |
| 2014/0117316 A1 * | 5/2014 | Choi ............................. | 257/40 |
| 2014/0312363 A1 * | 10/2014 | Ryu ............................. | 257/88 |

FOREIGN PATENT DOCUMENTS

KR    10-0462469 B1    12/2004

* cited by examiner

*Primary Examiner* — Allan R Wilson
(74) *Attorney, Agent, or Firm* — Knobbe Martens Olson & Bear LLP (57) ABSTRACT

An organic light-emitting display and methods of manufacturing the same are disclosed. In one aspect, an organic light-emitting apparatus includes a substrate, a display unit on the substrate, a step compensation layer formed on the display unit and supplementing a step on a surface of the display unit, a first intermediate layer formed on the step compensation layer, and an encapsulation layer formed on the first intermediate layer and sealing the display unit.

17 Claims, 3 Drawing Sheets

FIG. 6

ORGANIC LIGHT-EMITTING DISPLAY AND METHOD OF MANUFACTURING THE SAME

CROSS-REFERENCE TO RELATED APPLICATIONS

This application claims the benefit of Korean Patent Application No. 10-2013-0047694, filed on Apr. 29, 2013, in the Korean Intellectual Property Office, the disclosure of which is incorporated herein in its entirety by reference.

BACKGROUND

1. Field

The disclosed technology relates to an organic light-emitting display and a method of manufacturing the same, and more particularly, to an organic light-emitting apparatus including an encapsulation layer having excellent sealing properties, and a method of manufacturing the same.

2. Description of the Related Technology

An organic light-emitting diode (OLED) apparatus includes a hole injection electrode, an electron injection electrode, and an organic light-emitting component which includes an active light-emitting layer formed between the hole injection electrode and the electron injection electrode. An OLED is a self light-emitting device in which light is emitted by the transition of excitons from an excited state to a ground state. The excitons are generated by the combination of holes injected from the hole injection electrode and electrons injected from the electron injection electrode in the organic light-emitting layer.

A display formed of a matrix of OLEDs become commercially important as an advanced display device due to its low power, lightweight and thin profile. As a self light-emitting display, it does not require a separate light source. In addition, the organic light-emitting apparatus generally has other high-quality characteristics, including wide viewing angles, high contrast, and fast response speeds.

However, the operation of an OLED display can degrade due to external moisture or oxygen, and the organic light-emitting apparatus needs to be sealed to protect its components from the external moisture or oxygen.

SUMMARY OF CERTAIN INVENTIVE ASPECTS

The present disclosure provides an organic light-emitting apparatus having excellent sealing properties and reliability, and methods of manufacturing the same.

One aspect of the present disclosure provides an organic light-emitting display including: a substrate; a display unit on the substrate; a step compensation layer formed on the display unit and supplementing a step on a surface of the display unit; a first intermediate layer formed on the step compensation layer; and an encapsulation layer formed on the first intermediate layer and sealing the display unit, wherein the encapsulation layer is formed of an inorganic material with a low viscosity transition temperature, the first intermediate layer and the encapsulation layer comprise tin, and the tin in the first intermediate layer and the tin in the encapsulation layer form covalent bonds.

In some embodiments, the encapsulation layer may further include $P_2O_5$, $BPO_4$, $SnF_2$, or $WO_3$.

In some embodiments, the step compensation layer is formed of any one of acrylates and polyimides of a first group, or any one of $SiN_x$, $Al_2O_3$, $SiO_2$, and TiO of a second group.

In some embodiments, the first intermediate layer may be formed of zinc tin oxide (ZTO).

In some embodiments, the first intermediate layer may further include hydrogen or nitrogen.

In some embodiments, the thickness of the first intermediate layer may be in a range of about 50 nm to about 1000 nm.

In some embodiments, the organic light-emitting display may further include a second intermediate layer between the step compensation layer and the first intermediate layer, wherein the second intermediate layer may be formed of $SnO_2$.

In some embodiments, the tin (Sn) in the second intermediate layer and the tin in the first intermediate layer may form covalent bonds.

In some embodiments, the thickness of the second intermediate layer may be in a range of about 50 nm to about 200 nm.

Another aspect of the present disclosure relates to an organic light-emitting display including: a substrate; a display unit on the substrate; a step compensation layer formed on the display unit and supplementing a step on a surface of the display unit; a first intermediate layer formed on the step compensation layer; and an encapsulation layer formed on the first intermediate layer and sealing the display unit, wherein the first intermediate layer is formed of zinc tin oxide (ZTO) including hydrogen or nitrogen.

In some embodiments, the encapsulation layer may be formed of an inorganic material with a low viscosity transition temperature including tin, and the tin included in the first intermediate layer and the tin included in the encapsulation layer may form covalent bonds.

In some embodiments, the encapsulation layer may further include $P_2O_5$, $BPO_4$, $SnF_2$, or $WO_3$.

In some embodiments, the thickness of the first intermediate layer may be in a range of about 50 nm to about 1000 nm.

In some embodiments, the organic light-emitting display may further include a second intermediate layer between the step compensation layer and the first intermediate layer, wherein the second intermediate layer may be formed of $SnO_2$.

In some embodiments, the thickness of the second intermediate layer may be in a range of about 50 nm to about 200 nm.

Another aspect of the present disclosure provides a method of manufacturing an organic light-emitting display including: forming a display unit on a substrate; forming a step compensation layer to cover the display unit; forming a first intermediate layer to cover the step compensation layer; and forming an encapsulation layer to cover the first intermediate layer, wherein the first intermediate layer is formed by depositing a zinc tin oxide (ZTO) layer on the step compensation layer by sputtering, and hydrogen gas or nitrogen gas is introduced with argon gas during the sputtering.

In some embodiments, the content ratio of the hydrogen gas or the nitrogen gas introduced during the sputtering to the argon gas is in a range of about 0.002 to about 0.1.

In some embodiments, the forming of the encapsulation layer may include depositing an inorganic material with a low viscosity transition temperature including tin on the first intermediate layer; and performing a heat treatment on the deposited inorganic material with a low viscosity transition temperature.

In some embodiments, the tin included in the first intermediate layer and the tin included in the encapsulation layer may form covalent bonds.

In some embodiments, after the formation of the step compensation layer, the method may further include forming a second intermediate layer to cover the step compensation layer, wherein the second intermediate layer may be formed of $SnO_2$.

DETAILED DESCRIPTION OF CERTAIN INVENTIVE EMBODIMENTS

While the present disclosure is amenable to various modifications and alternative forms, specific embodiments have been shown by way of example in the drawings and are described in detail below. The intention, however, is not to limit the disclosure to the particular embodiments described. On the contrary, the present disclosure is intended to cover all modifications, equivalents, and alternatives falling within the scope of the present disclosure as defined by the appended claims. Moreover, detailed descriptions related to well-known functions or configurations will be ruled out in order not to unnecessarily obscure subject matters of the present invention.

Also, though terms like "first" and "second" are used to describe various elements in various embodiments of the present disclosure, the elements are not limited to these terms. These terms are used only to differentiate one element from another.

It will be understood that when an element such as a layer, film, region, or substrate is referred to as being "on" another element, it can be directly on the other element or one or more intervening elements may also be present.

Hereinafter, the present disclosure will be described in detail by explaining the embodiments with reference to the drawings. The same or like reference numerals in the drawings denote the same elements, and thus their description will be omitted. In the drawings, the thicknesses of layers and regions may be scaled up for clarity of illustration. Also, in the drawings, the thicknesses of some layers and regions may be exaggerated for convenience in description.

As used herein, the term "and/or" includes any and all combinations of one or more of the associated listed items. Expressions such as "at least one of," when preceding a list of elements, modify the entire list of elements and do not modify the individual elements of the list.

Figure 1:
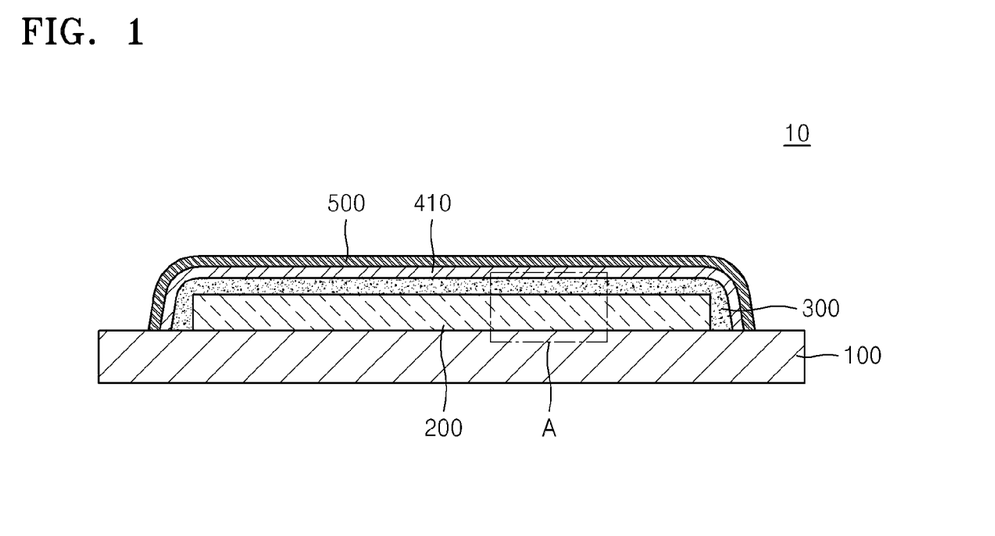
FIG. 1 is a cross-sectional view schematically illustrating an organic light-emitting display according to an embodiment.
Figure 2:
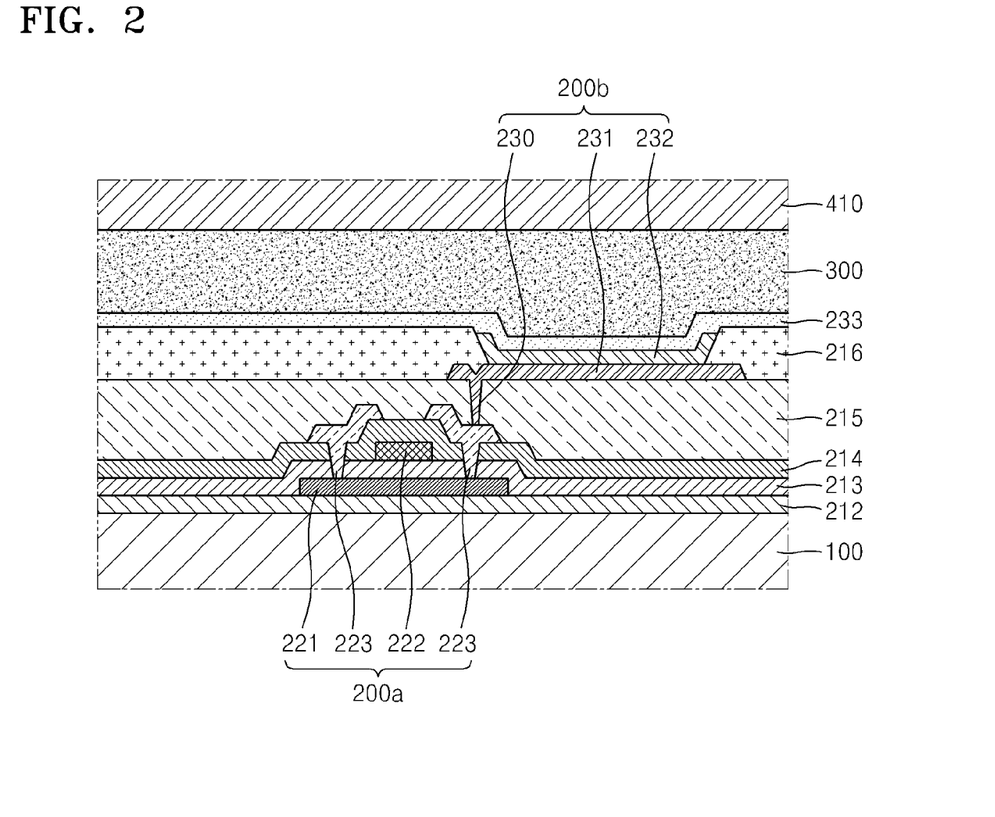
FIG. 2 is an enlarged view of region "A" of FIG. 1.

FIG. 1 is a cross-sectional view schematically illustrating an organic light-emitting display 10 according to an embodiment, and FIG. 2 is an enlarged view of region "A" of FIG. 1.

Referring to FIGS. 1 and 2, the organic light-emitting display 10 may include a substrate 100, a display unit 200 formed on the substrate 100, and a step compensation layer 300, a first intermediate layer 410, and an encapsulation layer 500 which are sequentially stacked on the display unit 200.

The substrate 100 may be formed of a transparent glass material including $SiO_2$ as a main component. However, the substrate 100 is not necessarily limited thereto and may be formed of a transparent plastic material. The transparent plastic material forming the substrate 100 may be an insulating organic material selected from the group consisting of polyethersulfone (PES), polyacrylate (PAR), polyetherimide (PEI), polyethylene naphthalate (PEN), polyethylene terephthalate (PET), polyphenylene sulfide (PPS), polyallylate, polyimide, polycarbonate (PC), triacetate cellulose (TAC), cellulose acetate propionate (CAP), and any combinations thereof.

In some embodiments, when the organic light-emitting display 10 is a bottom-emission type in which an image is formed in a direction pointing towards the substrate 100, the substrate 100 must be formed of a transparent material. casein some embodiments, when the organic light-emitting display 10 is a top-emission type in which an image is formed in a direction pointing away from the substrate 100, the substrate 100 can be formed of a transparent or a nontransparent material. In some embodiments, the substrate 100 may be formed of a metal. When the substrate 100 is formed of a non-transparent material, the substrate 100 may include one or more material selected from the group consisting of carbon, iron, chromium, manganese, nickel, titanium, molybdenum, stainless steel, and any combinations thereof. However, the present disclosure is not limited thereto.

The display unit 200 may include an organic thin film transistor (TFT) layer 200*a* and a pixel portion 200*b*. The pixel portion 200*b* may be an organic light-emitting device (OLED). Hereinafter, the display unit 200 will be described in more detail with reference to FIG. 2.

A buffer layer 212 may be formed on the substrate 100. The buffer layer 212 prevents the penetration of impurities into the substrate 100 and provides a flat surface on the substrate 100. The buffer layer 212 may be formed of various materials suitable to perform the above functions. For example, the buffer layer 212 may be formed of an inorganic material, including but not limited to silicon oxide, silicon nitride, silicon oxynitride, aluminum oxide, aluminum nitride, titanium oxide, and titanium nitride, and an organic material, such as polyimide, polyester, acryl, and any combinations thereof. In some embodiments, the buffer layer may be formed of a plurality of stacks thereof.

The buffer layer 212 may be deposited on the substrate 100 by various deposition methods, including but not limited to plasma-enhanced chemical vapour deposition (PECVD), atmospheric pressure CVD (APCVD), and low pressure CVD (LPCVD).

An active layer 221 may be formed of an inorganic semiconductor, including but not limited to silicon or an organic semiconductor on the buffer layer 212. Also, the active layer 221 may include a source region, a drain region, and a channel region therebetween.

For example, when the active layer 221 is formed using amorphous silicon, an amorphous silicon layer is formed on an entire surface of the substrate 100, and the amorphous silicon layer is then crystallized to form a polycrystalline silicon layer. Thereafter, the polycrystalline silicon layer is patterned, and the active layer 221, including the source region, the drain region, and the channel region therebetween, may then be formed by doping edges of the source region and the drain region with impurities.

A gate dielectric layer 213 is formed on the active layer 221. The gate dielectric layer 213 can insulate the gate electrode 222 from the active layer 221. The gate dielectric layer 213 may be formed of an inorganic material including but not limited to $SiN_x$ and $SiO_2$.

In some embodiments, the gate electrode 222 may be formed at a predetermined region on the gate dielectric layer 213. The gate electrode 222 is connected to a gate line (not shown) via which on/off signals are applied to a thin film transistor (TFT).

The gate electrode 222 may be formed of materials including but not limited to gold (Au), silver (Ag), copper (Cu), nickel (Ni), platinum (Pt), palladium (Pd), aluminum (Al), and molybdenum (Mo). The gate electrode 222 may also include an alloy, such as an aluminum Al:neodymium (Nd) alloy and a molybdenum Mo:tungsten (W) alloy. However, the gate electrode 222 is not limited thereto, and may be formed of various suitable materials depending on the design conditions.

An interlayer dielectric 214 is formed on the gate electrode 222 to insulate the gate electrode 222 from source and drain electrodes 223. The interlayer dielectric 214 may be formed of an inorganic material, such as $SiN_x$ and $SiO_2$.

The source and drain electrodes 223 may be formed on the interlayer dielectric 214. Specifically, the interlayer dielectric 214 and the gate dielectric layer 213 expose the source region and the drain region of the active layer 221, and the source and drain electrodes 223 contact with the exposed source region and drain region of the active layer 221.

Although FIG. 2 exemplifies a top-gate type TFT sequentially including the active layer 221, the gate electrode 222, and the source and drain electrodes 223, the present disclosure is not limited thereto, and the gate electrode 222 may be disposed under the active layer 221.

In some embodiments, the organic TFT layer 200a can drive the pixel portion 200b by being electrically connected to the pixel portion 200b. In some embodiments, the organic TFT layer 200a can be covered by a planarization layer 215.

An inorganic insulating layer and/or an organic insulating layer may be used as the planarization layer 215. The inorganic insulating layer may be formed of a material including but not limited to $SiO_2$, $SiN_x$, SiON, $Al_2O_3$, $TiO_2$, $Ta_2O_5$, $HfO_2$, $ZrO_2$, barium strontium titanate (BST), lead zirconium titanate (PZT), and any combinations thereof. The organic insulating layer may include a general purpose polymer (e.g., poly(methyl methacrylate) (PMMA), or polystyrene (PS)), a polymer derivative having a phenol group, an acryl-based polymer, an imide-based polymer, an arylether-based polymer, an amide-based polymer, a fluorine-based polymer, a p-xylene-based polymer, a vinyl alcohol-based polymer, and a blend thereof. Also, the planarization layer 215 may be formed as a composite stack of the inorganic insulating layer and the organic insulating layer.

The pixel portion 200b is formed on the planarization 215. The pixel portion 200b may include a pixel electrode 231, an intermediate layer 232, and a counter electrode 233.

The pixel electrode 231 is formed on the planarization layer 215, and is electrically connected to the source and drain electrodes 223 through a contact hole 230 formed in the planarization layer 215.

The pixel electrode 231 may be a reflective electrode. The pixel electrode 231 may include a reflective layer formed of Ag, magnesium (Mg), Al, Pt, Pd, Au, Ni, Nd, iridium (Ir), chromium (Cr), and any combinations thereof. In some embodiments, the pixel electrode can be a transparent or translucent electrode layer formed on the reflective layer.

The transparent or translucent electrode layer may include at least one or more material selected from the group consisting of indium tin oxide (TTO), indium zinc oxide (IZO), zinc oxide (ZnO), indium oxide ($In_2O_3$), indium gallium oxide (IGO), aluminium zinc oxide (AZO), and any combinations thereof.

The counter electrode 233, which is disposed to face the pixel electrode 231, may be a transparent or translucent electrode. In some embodiments, the counter electrode 233 may be formed as a thin film of a metal including lithium (Li), calcium (ca), LiF/Ca, LiF/Al, Al, Ag, Mg, and any combination thereof. In addition, an auxiliary electrode layer or a bus electrode for forming a transparent electrode may be further formed on the metal thin film. In some embodiments, the auxiliary electrode layer or a bus electrode can be formed of a material including TTO, IZO, ZnO, and $In_2O_3$.

Therefore, the counter electrode 233 may transmit light emitted from an organic light-emitting layer (not shown) included in the intermediate layer 232. That is, the light emitted from the organic light-emitting layer (not shown) may be emitted toward the counter electrode 233 by being directly reflected or indirectly reflected by the pixel electrode 231 composed of the reflective electrode.

However, the organic light-emitting display 10 of the present description is not limited to a top-emission type, and may be a bottom-emission type. In a bottom-emission type, the light emitted from the organic light-emitting layer (not shown) is emitted in a direction facing toward the substrate 100. In this case, the pixel electrode 231 may be composed of a transparent or translucent electrode, and the counter electrode 233 may be composed of a reflective electrode. In some embodiments, the organic light-emitting display 10 may be a dual-emission type in which light is emitted in both top and bottom directions.

A pixel-defining layer 216 is formed of an insulating material on the pixel electrode 231. The pixel-defining layer 216 may be formed of one or more organic insulating materials selected from the group consisting of polyimide, polyamide, acryl resin, benzocyclobutane, and phenol resin. The pixel-defining layer 216 may be formed by using a method such as spin coating. The pixel-defining layer 216 exposes a predetermined region of the pixel electrode 231, and the intermediate layer 232, including the organic light-emitting layer, is disposed on the exposed region of the pixel electrode 231.

The organic light-emitting layer (not shown) included in the intermediate layer 232 may be a low molecular weight organic material or a polymer organic material. The intermediate layer 232 may optionally include functional layers, such as a hole transport layer (HTL), a hole injection layer (HIL), an electron transport layer (ETL), and an electron injection layer (EIL), in addition to the organic light-emitting layer (not shown).

Figure 3:
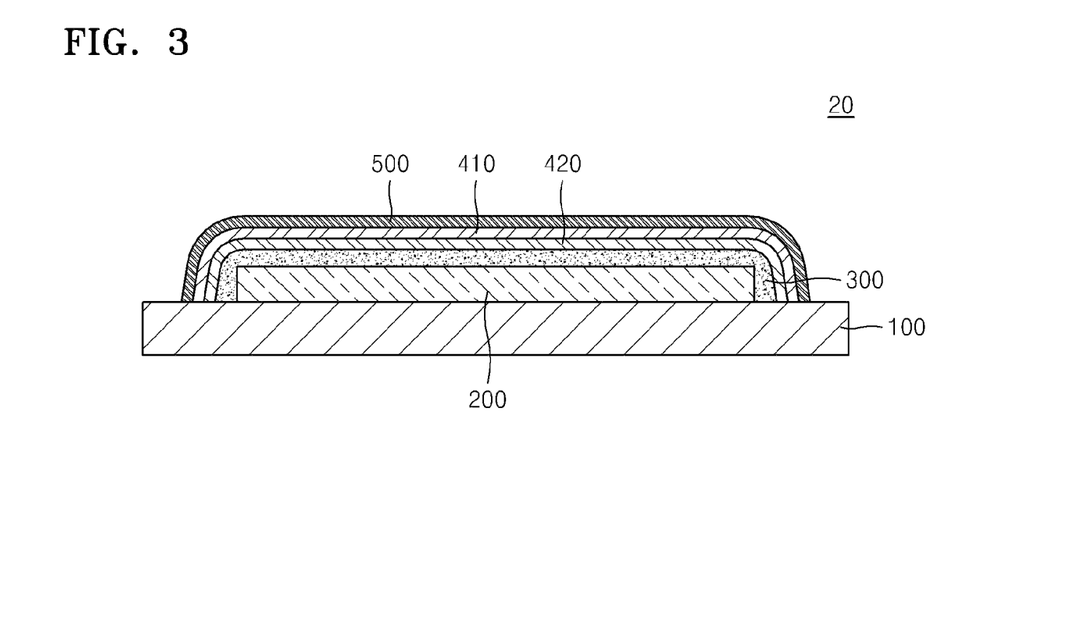
FIG. 3 is a cross-sectional view schematically illustrating a modified example of the organic light-emitting display of FIG. 1.

As shown in FIG. 3, the step compensation layer 300 is formed on the display unit 200 to supplement a step on a surface of the display unit 200, and also, covers foreign matter, such as particles, attached to the surface of the display unit 200 during a process of forming the organic light-emitting layer (not shown) or other processes. That is, the step compensation layer 300 may be formed to such a thickness that the step compensation layer 300 supplements a step existing on the surface of the display unit 200 and also sufficiently covers particles existing on the surface of the display unit 200. Also, the step compensation layer 300 may be formed to have a wider area than that of the display unit 200, and thus, all edges of the step compensation layer 300 may be in contact with the substrate 100.

When the step compensation layer 300 is formed as described above, the encapsulation layer 500 may not be formed to have a large thickness in order to cover the step or particles on the surface of the display unit 200. As described below, the encapsulation layer 500 may be formed of an inorganic material with a low viscosity transition temperature to effectively prevent the penetration of external oxygen or moisture. However, since stress generated in the encapsulation layer 500 increases with the thickness of the encapsulation layer 500, the thickness of the encapsulation layer 500 may be decreased by forming the step compensation layer 300. Therefore, the stress generated in the encapsulation layer 500 may be minimized.

Also, since the step compensation layer 300 has a flat top surface, the formation of the encapsulation layer 500 may be facilitated and the generation of cracks in the encapsulation layer 500 having rigid characteristics due to external pressure may be prevented. That is, the encapsulation layer 500 formed of the inorganic material with a low viscosity transition temperature may have excellent ability to block external moisture and oxygen, but cracks may be easily generated due to the rigid characteristics when force is focused on one point. For example, when a surface forming the encapsulation layer 500 has a step or particles, external force applied to the encapsulation layer 500 during processes may be focused on the step or particles. Thus, cracks may occur in the encapsulation layer 500. As a result, dark spots and pixel shrinkage may occur in the organic light-emitting display 10. However, since the step compensation layer 300 is formed, the reliability of the organic light-emitting display 10 may be improved.

The step compensation layer 300 may be formed of any one of acrylates and polyimides of a first group, or any one of $SiN_x$, $Al_2O_3$, $SiO_2$, and TiO of a second group. However, the step compensation layer 300 is not limited thereto. For example, the step compensation layer 300 may be formed of an acryl-based polymer, an imide-based polymer, an arylether-based polymer, an amide-based polymer, a fluorine-based polymer, a p-xylene-based polymer, a vinyl alcohol-based polymer, $SiO_2$, $SiN_x$, SiON, $Al_2O_3$, $TiO_2$, $Ta_2O_5$, $HfO_2$, $ZrO_2$, BST, PZT, and any combinations thereof.

Figure 5:
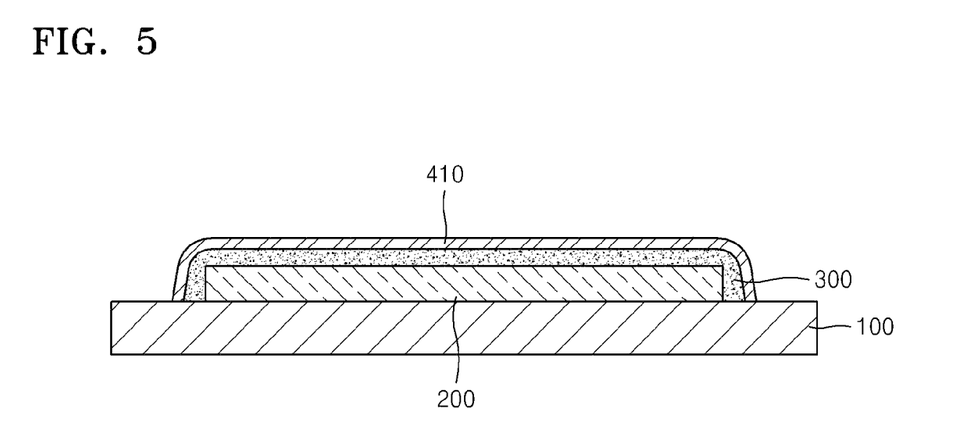

In FIG. 5, a first intermediate layer 410 is formed on the step compensation layer 300. The first intermediate layer 410 functions as a buffer layer to prevent the delamination of the encapsulation layer 500 and relieve the stress of the encapsulation layer 500. The first intermediate layer 410 is formed to cover the step compensation layer 300 and thus, all edges of the first intermediate layer 410 may be in contact with the substrate 100.

The first intermediate layer 410 may be formed of tin materials. More particularly, the first intermediate layer 410 may be formed of zinc tin oxide (ZTO). Since the first intermediate layer 410 formed of ZTO has excellent light transmittance and dense characteristics, the first intermediate layer 410 formed of ZTO may function as another barrier layer in addition to the encapsulation layer 500.

Since the encapsulation layer 500 is also formed of an inorganic material with a low viscosity transition temperature including tin, tin in the first intermediate layer 410 and tin in the encapsulation layer 500 may form covalent bonds. Therefore adhesion between the first intermediate layer 410 and the encapsulation layer 500 may be excellent. Accordingly, the reliability of the organic light-emitting display 10 may be improved by effectively preventing the delamination of the encapsulation layer 500.

In some embodiments, the first intermediate layer 410 may further include nitrogen. When the first intermediate layer 410 further includes nitrogen atoms as an impurity, the density of the first intermediate layer 410 relatively decreases, and as a result, the first intermediate layer 410 may function to buffer the stress of the encapsulation layer 500. In some embodiments, the first intermediate layer 410 may include hydrogen atoms as an impurity, instead of the nitrogen atoms. Even in a case where the first intermediate layer 410 includes hydrogen atoms, the delamination and the generation of the cracks of the encapsulation layer 500 may be prevented by relieving the stress of the encapsulation layer 500.

The first intermediate layer 410 may be formed to have a thickness ranging from about 50 nm to about 1000 nm. When the thickness of the first intermediate layer 410 is less than about 50 nm, an effect of the first intermediate layer 410 as a buffer layer relieving the stress of the encapsulation layer 500 may be halved. In contrast, when the thickness of the first intermediate layer 410 is greater than about 1000 nm, damage, such as delamination or cracks, to the first intermediate layer 410 may occur due to the stress of the first intermediate layer 410 itself. Therefore, the first intermediate layer 410 may be formed to have a suitable thickness ranging from about 50 nm to about 1000 nm.

In some embodiments, the encapsulation layer 500 prevents the penetration of external moisture and oxygen into the display unit 200 by sealing the display unit 200. Since the encapsulation layer 500 is formed to have a wider area than that of the first intermediate layer 410, all edges of the encapsulation layer 500 may be in contact with the substrate 100. As a result, the penetration of outside air may be prevented.

The encapsulation layer 500 may be formed of an inorganic material with a low viscosity transition temperature. Herein, the expression "viscosity transition temperature" denotes a minimum temperature at which fluidity may be provided to the inorganic material with a low viscosity transition temperature, wherein the viscosity transition temperature may be lower than a degeneration temperature of a material included in the OLED. Also, the expression "degeneration temperature of a material included in the OLED" denotes a temperature at which chemical and/or physical degeneration of the material included in the OLED may occur. For example, the expression "degeneration temperature of a material included in the OLED" may denote a glass transition temperature ($T_g$) of an organic material included in the intermediate layer 232 of the OLED.

The $T_g$, for example, may be deduced from results of thermal analysis ($N_2$ atmosphere, with a temperature range: room temperature to 600° C. (10° C./min)-Thermo Gravimetric Analysis (TGA), room temperature to 400° C.-Differential Scanning calorimetry (DSC), pan type: Pt pan in disposable Al pan (TGA), disposable Al pan (DSC)) of the material included in the OLED by TGA and DSC, as is known to those skilled in the art.

The inorganic material with a low viscosity transition temperature may include a single compound or may be a mixture composed of two or more compounds.

The inorganic material with a low viscosity transition temperature may include tin oxide (e.g., SnO or $SnO_2$). In a case where the inorganic material with a low viscosity transition temperature includes SnO, a content of the SnO may be in a range from about 20 wt % to about 100 wt %.

Also, the inorganic material with a low viscosity transition temperature may further include one or more of phosphate (e.g., $P_2O_5$), boron phosphate ($BPO_4$), tin fluoride (e.g., $SnF_2$), niobium oxide (e.g., NbO), and tungsten oxide (e.g., $WO_3$). However, the inorganic material with a low viscosity transition temperature is not limited thereto.

For example, the inorganic material with a low viscosity transition temperature may include:

SnO;
SnO and $P_2O_5$;
SnO and $BPO_4$;
SnO, $SnF_2$, and $P_2O_5$;
SnO, $SnF_2$, $P_2O_5$, and NbO; or
SnO, $SnF_2$, $P_2O_5$, and $WO_3$.

However, the inorganic material with a low viscosity transition temperature is not limited thereto.

For example, the inorganic material with a low viscosity transition temperature may have the following composition, but the inorganic material with a low viscosity transition temperature is not limited thereto:
1) SnO (100 wt %);
2) SnO (80 wt %) and $P_2O_5$ (20 wt %);
3) SnO (90 wt %) and $BPO_4$ (10 wt %);
4) SnO (20 wt %-50 wt %), $SnF_2$ (30 wt %-60 wt %), and $P_2O_5$ (10 wt %-30 wt %) (where a sum of weight percentages of SnO, $SnF_2$, and $P_2O_5$ is 100 wt %);
5) SnO (20 wt %-50 wt %), $SnF_2$ (30 wt %-60 wt %), $P_2O_5$ (10 wt %-30 wt %), and NbO (1 wt %-5 wt %) (where a sum of weight percentages of SnO, $SnF_2$, $P_2O_5$, and NbO is 100 wt %); or
6) SnO (20 wt %-50 wt %), $SnF_2$ (30 wt %-60 wt %), $P_2O_5$ (10 wt %-30 wt %), and $WO_3$ (1 wt %-5 wt %) (where a sum of weight percentages of SnO, $SnF_2$, $P_2O_5$, and $WO_3$ is 100 wt %).

For example, the inorganic material with a low viscosity transition temperature may include SnO (42.5 wt %), $SnF_2$ (40 wt %), $P_2O_5$ (15 wt %), and $WO_3$ (2.5 wt %). However, the inorganic material with a low viscosity transition temperature is not limited thereto.

FIG. 3 is a cross-sectional view schematically illustrating a modified example of the organic light-emitting display of FIG. 1.

Referring to FIG. 3, an organic light-emitting display 20 may include a substrate 100, a display unit 200 formed on the substrate 100, a step compensation layer 300 formed on the display unit 200, a second intermediate layer 420 formed on the step compensation layer 300, a first intermediate layer 410 formed on the second intermediate layer 420, and an encapsulation layer 500 formed on the first intermediate layer 410.

Since the substrate 100, the display unit 200, the step compensation layer 300, the first intermediate layer 410, and the encapsulation layer 500 are the same as those illustrated and described in FIGS. 1 and 2, repeated descriptions are not provided.

The second intermediate layer 420 may be formed between the step compensation layer 300 and the first intermediate layer 410, and may be formed of $SnO_2$.

The second intermediate layer 420 may be formed to have a thickness of about 200 nm or less. When the thickness of the second intermediate layer 420 is formed to be about 200 nm or less, the second intermediate layer 420 may function as another buffer layer which additionally relieves the stress of the encapsulation layer 500. However, when the thickness of the second intermediate layer 420 is greater than about 200 nm, since the stress of the second intermediate layer 420 rather increases, delamination of the second intermediate layer 420 may occur. Also, since the second intermediate layer 420 may be formed of $SnO_2$, the second intermediate layer 420 may function as another barrier layer blocking the penetration of external moisture and oxygen. For this purpose, the second intermediate layer 420 may be formed to have a thickness of about 50 nm or more.

Since both of the second intermediate layer 420 and the first intermediate layer 410 include tin, tin in the second intermediate layer 420 and tin in the first intermediate layer 410 may form covalent bonds. As a result, the adhesion between the second intermediate layer 420 and the first intermediate layer 410 may be improved. Therefore, kinematic characteristics and the reliability of the organic light-emitting apparatus 20 may be improved.

Figure 4:
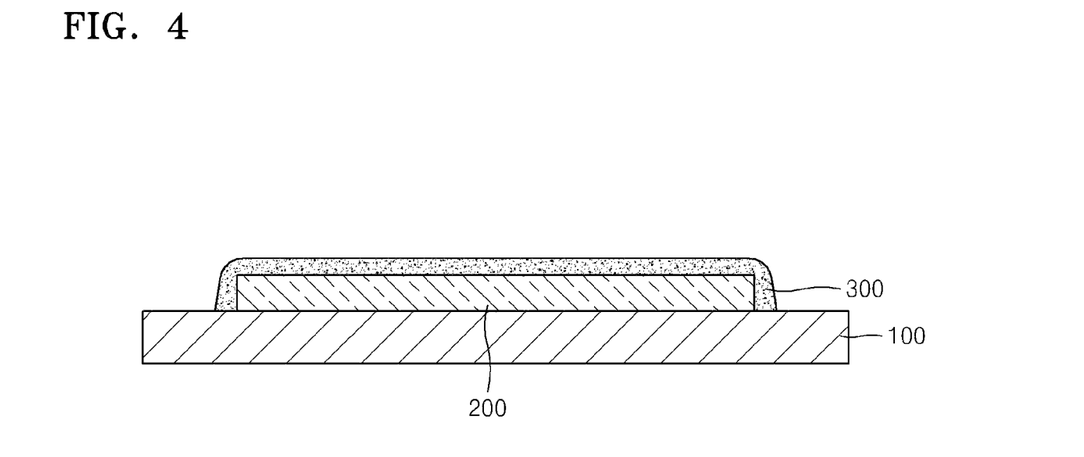
FIGS. 4 through 6 are cross-sectional views schematically illustrating a method of manufacturing the organic light-emitting display of FIG. 1, according to an embodiment.
Figure 6:
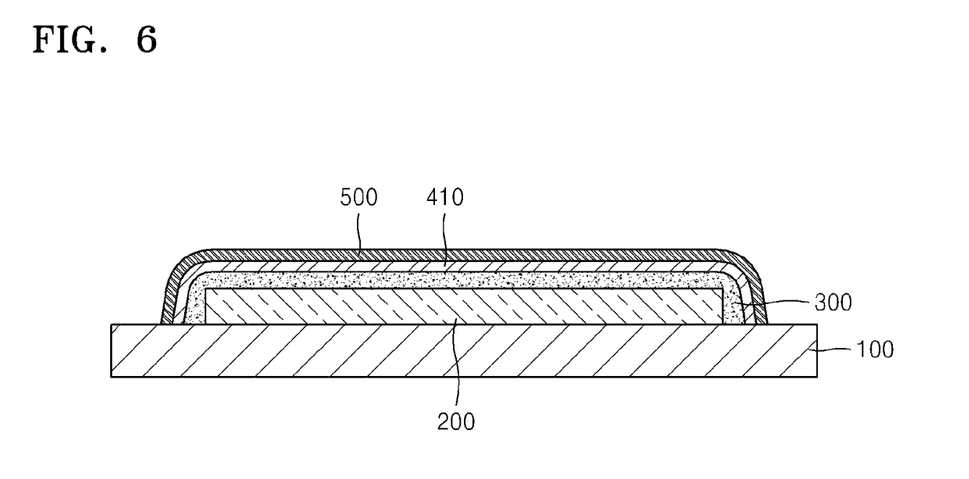

FIGS. 4 through 6 are cross-sectional views schematically illustrating a method of manufacturing the organic light-emitting display of FIG. 1, according to some embodiments.

The method of manufacturing an organic light-emitting display is described herein with reference to FIGS. 4 to 6. The display unit 200 is first formed on a substrate 100 as described in FIG. 4, and a step compensation layer 300 is then formed to cover the display unit 200.

Since the display unit 200 is the same as the one described in FIG. 2 and various known organic light-emitting apparatus may be applied thereto, a particular manufacturing method thereof is omitted.

When the step compensation layer 300 is formed of either one of acrylates and polyimides of the first group, the step compensation layer 300 may be formed by spraying, spin coating, and slit coating. Also, when the step compensation layer 300 is formed of any one of $SiN_x$, $Al_2O_3$, $SiO_2$, and $TiO_2$ of the second group, the step compensation layer 300 may be formed by CVD or atomic layer deposition (ALD), which has good coverage characteristics.

The step compensation layer 300 may be formed to such a thickness that the step compensation layer 300 supplements a step existing on the surface of the display unit 200 and also sufficiently covers particles existing on the surface of the display unit 200.

Next, as illustrated in FIG. 5, a first intermediate layer 410 is formed on the step compensation layer 300. The first intermediate layer 410 may be formed by resistance heating evaporation, sputtering, low temperature deposition, electron beam coating, spin coating, or ion plating.

For example, the first intermediate layer 410 may be formed by sputtering simultaneously using a ZnO target and a $SnO_2$ target, and nitrogen gas as well as argon gas may be introduced into a process chamber during sputtering.

When the nitrogen gas is introduced during sputtering, nitrogen atoms are included in the first intermediate layer 410 as an impurity. As a result, the density of the first intermediate layer 410 may decrease. Since the density of the first intermediate layer 410 is low, compressive stress of the first intermediate layer 410 is decreased. Thus, the first intermediate layer 410 may function as a buffer layer buffering the stress of the encapsulation layer 500.

In some embodiments, the amount ratio of the introduced nitrogen gas to the argon gas may be in a range of about 0.002 to about 0.1. When the amount ratio of the introduced nitrogen gas to the argon gas is less than 0.002, the first intermediate layer 410 may not function as a buffer layer. In contrast, when the amount ratio of the introduced nitrogen gas to the argon gas is greater than 0.1, the adhesion between the first intermediate layer 410 and the encapsulation layer 500 may decrease, because covalent bonds between tin included in the first intermediate layer 410 and tin included in the encapsulation layer 500 may not be sufficiently formed. Therefore, the amount ratio of the introduced nitrogen gas to the argon gas may be in a range of about 0.002 and about 0.1.

Also, the same result as the one described above may be obtained even when hydrogen is introduced instead of nitrogen, and an amount of the introduced hydrogen may be the same as that of the introduced nitrogen. Furthermore, the compressive stress of the first intermediate layer 410 may be controlled by a method of increasing process pressure (e.g., about 1 Pa or more).

Although not illustrated in FIG. 5, before the formation of the first intermediate layer 410, the second intermediate layer 420 in FIG. 3 formed of $SnO_2$ may be further formed. The second intermediate layer 420 in FIG. 3 may be formed by sputtering, vacuum evaporation, low-temperature deposition, PECVD, plasma ion-assisted deposition (PIAD), electron beam coating, or ion plating.

Also, the second intermediate layer 420 in FIG. 3 may be formed to have a thickness ranging from about 50 nm to about 200 nm so as to function as another barrier layer blocking external moisture and oxygen and as another buffer layer relieving the stress of the encapsulation layer 500.

Finally, an encapsulation layer 500 may be formed as illustrated in FIG. 6.

The encapsulation layer 500 may be formed by depositing the inorganic material with a low viscosity transition temperature described in FIGS. 1 and 2 on the display unit 200 by sputtering, vacuum evaporation, low-temperature deposition, PECVD, PIAD, electron beam coating, or ion plating. A heat treatment of the deposited inorganic material with a low viscosity transition temperature may be further included if necessary.

For example, the encapsulation layer 500 may be formed by sputtering using a target having a composition of SnO—SnF$_2$—P$_2$O$_5$—WO$_3$. A method of using dual rotary targets is specifically used for the sputtering and a method of scanning by moving the substrate 100 may be used during the sputtering.

The deposited encapsulation layer 500 may include defects such as pin holes. In this case, the defects, such as pin holes, are removed by heat treating the deposited encapsulation layer 500, and thus, a dense encapsulation layer 500 may be formed.

The heat treatment may be performed above the viscosity transition temperature of the inorganic material which has a low viscosity transition temperature. For example, the heat treatment may be performed by heat treating the inorganic material with a low viscosity transition temperature in a temperature range of the viscosity transition temperature of the inorganic material or more to less than the degeneration temperature of the material included in the OLED. Herein, "the viscosity transition temperature of the inorganic material with a low viscosity transition temperature" may vary according to the composition of the inorganic material with a low viscosity transition temperature, and "the degeneration temperature of the material included in the OLED" may vary according to the material used in the OLED. However, the composition of the inorganic material with a low viscosity transition temperature and components of the material used in the OLED may be easily recognized by those skilled in the art (e.g., the evaluation of $T_g$ deduced from results of TGA analysis of the material included in the OLED).

Also, the heat treatment may be performed in an infrared (IR) oven in a vacuum atmosphere or an inert gas atmosphere (e.g., N$_2$ atmosphere or Ar atmosphere), in order to prevent exposure to the external environment of the OLED through pin holes.

In some embodiments, since an encapsulation layer is formed of an inorganic material with a low viscosity transition temperature, the encapsulation layer may have excellent moisture and oxygen-blocking ability.

Also, since a first intermediate layer acting as a step compensation layer and a buffer layer is further included under the encapsulation layer, adhesion of the encapsulation layer may be improved and damage, such as cracks, which may occur in the encapsulation layer, may be prevented. Thus, the reliability of an organic light-emitting display may be improved.

In addition, the effects of the present disclosure may also be deduced from the above descriptions with reference to the accompanying drawings.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. An organic light-emitting display comprising:
    a substrate;
    an organic light-emitting display unit including a thin film transistor and an organic light-emitting device on the substrate;
    a step compensation layer formed on the organic light-emitting display unit and supplementing a step on a surface of the organic light-emitting display unit;
    a first intermediate layer formed on the step compensation layer; and
    an encapsulation layer formed on the first intermediate layer and sealing the display unit,
    wherein the encapsulation layer is formed of an inorganic material, and
    wherein each of the first intermediate layer and the encapsulation layer comprises tin, and the tin in the first intermediate layer and the tin in the encapsulation layer form covalent bonds.

2. The organic light-emitting display of claim 1, wherein the encapsulation layer further comprises P$_2$O$_5$, BPO$_4$, SnF$_2$, or WO$_3$.

3. The organic light-emitting display of claim 1, wherein the step compensation layer is formed of any one of acrylates and polyimides of a first group, or any one of SiN$_x$, Al$_2$O$_3$, SiO$_2$, and TiO of a second group.

4. The organic light-emitting display of claim 1, wherein the first intermediate layer is formed of zinc tin oxide (ZTO).

5. The organic light-emitting display of claim 4, wherein the first intermediate layer further comprises hydrogen or nitrogen.

6. The organic light-emitting display of claim 4, wherein the thickness of the first intermediate layer is in a range of about 50 nm to about 1000 nm.

7. The organic light-emitting display of claim 1, further comprising a second intermediate layer between the step compensation layer and the first intermediate layer, wherein the second intermediate layer is formed of SnO$_2$.

8. The organic light-emitting display of claim 7, wherein the tin (Sn) in the second intermediate layer and the tin in the first intermediate layer form covalent bonds.

9. The organic light-emitting display of claim 7, wherein a thickness of the second intermediate layer is in a range of about 50 nm to about 200 nm.

10. The organic light-emitting display unit of claim 1, wherein the step compensation layer directly contacts the substrate.

11. The organic light-emitting display unit of claim 1, wherein the encapsulation layer directly contacts the substrate.

12. An organic light-emitting display comprising:
    a substrate;
    an organic light-emitting display unit including a thin film transistor and an organic light-emitting device formed on the substrate;
    a step compensation layer formed on the organic light-emitting display unit and supplementing a step on a surface of the organic light-emitting display unit;
    a first intermediate layer formed on the step compensation layer; and
    an encapsulation layer formed on the first intermediate layer and sealing the organic light-emitting display unit,
    wherein the first intermediate layer is substantially formed of zinc tin oxide (ZTO) comprising hydrogen or nitrogen.

13. The organic light-emitting display of claim 12, wherein the encapsulation layer is formed of an inorganic material and comprises tin, and wherein the tin included in the first intermediate layer and the tin included in the encapsulation layer form covalent bonds.

14. The organic light-emitting display of claim 13 the encapsulation layer further comprises $P_2O_5$, $BPO_4$, $SnF_2$, or $WO_3$.

15. The organic light-emitting display of claim 12, wherein the thickness of the first intermediate layer is in a range of about 50 nm to about 1000 nm.

16. The organic light-emitting display of claim 12, further comprising a second intermediate layer between the step compensation layer and the first intermediate layer, wherein the second intermediate layer is formed of $SnO_2$.

17. The organic light-emitting display of claim 16, wherein the thickness of the second intermediate layer is in a range of about 50 nm to about 200 nm.

* * * * *